United States Patent
Hwang et al.

(10) Patent No.: US 9,019,255 B2
(45) Date of Patent: Apr. 28, 2015

(54) POLARIZER FILM, AND ORGANIC LIGHT EMITTING DISPLAY APPARATUS PROVIDING THE SAME

(75) Inventors: Sung-Joo Hwang, Youngin (KR); Hee-Chul Jeon, Youngin (KR); Jung-I Yun, Youngin (KR); Sae-Hee Lim, Youngin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 652 days.

(21) Appl. No.: 12/752,760

(22) Filed: Apr. 1, 2010

(65) Prior Publication Data

US 2011/0148839 A1 Jun. 23, 2011

(30) Foreign Application Priority Data

Dec. 22, 2009 (KR) ........................ 10-2009-0129128

(51) Int. Cl.
*G06F 3/038* (2013.01)
*G09G 5/00* (2006.01)
*G02B 5/20* (2006.01)
*H01L 51/52* (2006.01)
*G02B 5/30* (2006.01)

(52) U.S. Cl.
CPC .............. *G02B 5/205* (2013.01); *G02B 5/3033* (2013.01); *H01L 51/5262* (2013.01)

(58) Field of Classification Search
None
See application file for complete search history.

(56) References Cited

U.S. PATENT DOCUMENTS

| 4,396,646 | A | * | 8/1983 | Schuler et al. | 427/163.1 |
|---|---|---|---|---|---|
| 6,407,783 | B1 | * | 6/2002 | Ohgawara et al. | 349/110 |
| 7,256,937 | B2 | * | 8/2007 | Volke et al. | 359/487.04 |
| 2002/0158568 | A1 | * | 10/2002 | Satake | 313/493 |
| 2003/0081315 | A1 | | 5/2003 | Kobayashi | |
| 2004/0114248 | A1 | * | 6/2004 | Hokazono et al. | 359/603 |
| 2005/0117098 | A1 | * | 6/2005 | Kurasawa | 349/114 |
| 2006/0176417 | A1 | * | 8/2006 | Wu et al. | 349/58 |

FOREIGN PATENT DOCUMENTS

| JP | 07-142170 | 6/1995 |
|---|---|---|
| JP | 2000-003793 | 1/2000 |
| KR | 10-0495743 B1 | 6/2005 |

OTHER PUBLICATIONS

Registration Determination Certificate issued by the Korean Intellectual Property Office issued Mar. 1, 2011.

* cited by examiner

*Primary Examiner* — Jesus Hernandez
(74) *Attorney, Agent, or Firm* — Knobbe Martens Olson & Bear LLP

(57) ABSTRACT

An organic light emitting display apparatus includes a polarizer film arranged on a substrate or an encapsulation substrate that faces an image realized by a display unit, wherein the polarizer film includes a plurality of regions having different light transmittances. By using the polarizer film, a luminance difference due to a voltage drop may be compensated for so that a uniform luminance may be obtained when the image is realized.

11 Claims, 4 Drawing Sheets

POLARIZER FILM, AND ORGANIC LIGHT EMITTING DISPLAY APPARATUS PROVIDING THE SAME

CROSS-REFERENCE TO RELATED APPLICATIONS

This application claims the benefit of Korean Patent Application No. 10-2009-0129128, filed on Dec. 22, 2009, in the Korean Intellectual Property Office, the disclosure of which is incorporated herein in its entirety by reference.

BACKGROUND OF THE INVENTION

1. Field of the Invention

One or more embodiments relate to an organic light emitting display apparatus, and more particularly, to an organic light emitting display apparatus including an improved polarizer film, and the polarizer film thereof.

2. Description of the Related Art

Recently, some display apparatuses have been replaced with portable thin flat display apparatuses. One of these flat display apparatuses is an electroluminescent display apparatus which is an active matrix type display apparatus that is expected to become a next generation display apparatus due to its wide viewing angle, high contrast, and fast response speed. Also, compared to an inorganic light emitting display apparatus, an organic light emitting display apparatus having an emissive layer comprising an organic material has superior features in terms of luminance, driving voltage, response speed, and its capability to realize multi-colors.

The organic light emitting display apparatus may have a problem in that a luminance difference between regions of a panel may occur due to a voltage drop. The organic light emitting display apparatus includes common electrodes for applying a constant voltage to entire pixels, and in this regard, when voltage is applied to the common electrodes, the constant voltage may be normally applied to a region adjacent to a voltage applying unit whereas voltage less than a desired constant voltage is applied to another region farther from the voltage applying unit since a voltage drop occurs due to an increase in resistance. When the constant voltage decreases, a voltage difference between a common electrode and pixel electrodes arranged in a corresponding pixel also decreases so that luminance relatively deteriorates, compared to the region to which the constant voltage is normally applied. Recently, the size of panels has become large-scale so that the luminance difference due to the voltage drop increases even more.

The present embodiments discussed below overcome the problems discussed above as well as provide additional advantages.

SUMMARY OF THE INVENTION

One or more embodiments include an improved polarizer film and an organic light emitting display apparatus including the improved polarizer film whereby a luminance difference between regions of a panel may be resolved.

Additional aspects will be set forth in part in the description which follows and, in part, will be apparent from the description, or may be learned by practice of the presented embodiments.

According to one or more embodiments, an organic light emitting display apparatus includes a substrate; a display unit arranged on the substrate and realizing an image; a voltage applying unit for applying voltage to the display unit; an encapsulation substrate for encapsulating the display unit; and a polarizer film arranged on the substrate or the encapsulation substrate that faces the image realized by the display unit, wherein the polarizer film comprises a plurality of regions having different light transmittances.

The plurality of regions may include a first region that is in the display unit and that is relatively adjacent to the voltage applying unit, and a second region that is in the display unit and that is relatively far from the voltage applying unit, and light transmittance of the second region may be higher than light transmittance of the first region.

The voltage applying unit may be arranged to surround the display unit, and the second region may correspond to a center region of the display unit, the first region may correspond to end portions of the display unit, and the end portions may surround the second region.

The voltage applying unit may be arranged to be adjacent to one side region of the display unit, the first region may correspond to the one side region of the display unit, and the second region may correspond to another side region of the display unit.

The display unit may include a pixel electrode arranged in each pixel, and a common electrode arranged to extend over entire pixels, and the voltage applying unit may apply constant voltage to the common electrode via a predetermined voltage line.

The polarizer film may include a polyvinyl alcohol film having absorbed iodine, and light transmittances of the plurality of regions may become different from each other according to a difference between amounts of the iodine absorbed by the polyvinyl alcohol film.

The difference between the amounts of the absorbed iodine may be due to spraying of the polyvinyl alcohol film with an iodine liquid while a portion of the polyvinyl alcohol film is covered.

The difference between the amounts of the absorbed iodine may be due to a difference between time periods during which the polyvinyl alcohol film is soaked in an iodine liquid.

According to one or more embodiments, a polarizer film includes a plurality of regions on a main portion for transmitting light, wherein the plurality of regions have different light transmittances.

The plurality of regions may include a first region corresponding to a center region of the main portion, and a second region corresponding to end regions of the main portion surrounding the first region, and the plurality of regions may include a first region corresponding to one end region of the main portion, and a second region corresponding to other end region of the main portion.

The main portion may include a polyvinyl alcohol film having absorbed iodine, and light transmittances of the plurality of regions may become different from each other according to a difference between amounts of the iodine absorbed by the polyvinyl alcohol film.

The difference between the amounts of the absorbed iodine may be due to spraying of the polyvinyl alcohol film with an iodine liquid while a portion of the polyvinyl alcohol film is covered, and the difference between the amounts of the absorbed iodine may due to a difference between time periods during which the polyvinyl alcohol film is soaked in an iodine liquid.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION OF THE INVENTION

Figure 1:
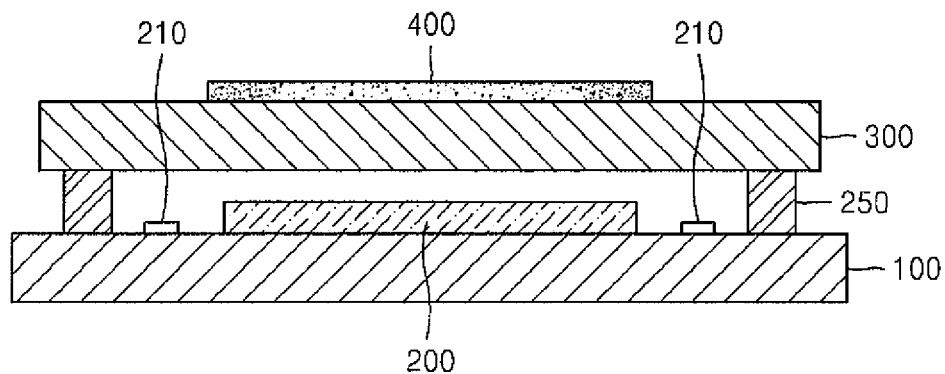
FIG. 1 is a cross-sectional view of an organic light emitting display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

FIG. 1 is a cross-sectional view of an organic light emitting display apparatus according to an embodiment.

Referring to FIG. 1, a display unit 200 including an organic light emitting diode (OLED) is arranged on a substrate 100.

The substrate 100 may comprise transparent glass containing SiO2 as a main component, but is not limited thereto, and thus may also comprise a transparent plastic material that may be an insulating organic material, for example, polyethersulphone (PES), polyacrylate (PAR), polyetherimide (PEI), polyethyelene napthalate (PEN), polyethyelene terephthalate (PET), polyphenylene sulfide (PPS), polyallylate, polyimide, polycarbonate (PC), triacetate cellulose (TAC), and cellulose acetate propionate (CAP).

If the organic light emitting display apparatus is a bottom emission type organic light emitting display apparatus in which an image is realized toward the substrate 100, the substrate 100 can be formed by using a transparent material. However, if the organic light emitting display apparatus is a top emission type organic light emitting display apparatus in which an image is realized away from the substrate 100, the substrate 100 may or may not comprise a transparent material, and, in this case, the substrate 100 may comprise a metal. When the substrate 100 is formed of a metal, the substrate 100 may include at least one material, such as, for example, carbon, iron, chromium, manganese, nickel, titanium, molybdenum, stainless steel (SUS), Invar alloys, Inconel alloys, and Kovar alloys, but is not limited thereto, and thus the substrate 100 may also comprise a metal foil.

A buffer layer 211 (refer to FIG. 4) may be further formed on a top surface of the substrate 100 so as to planarize the substrate 100 and to prevent penetration of impurities into the substrate 100.

The substrate 100 having the display unit 200 arranged thereon is bonded with an encapsulation substrate 300 that is arranged above the display unit 200. The encapsulation substrate 300 may comprise a glass but may also comprise one of various plastic materials including amyl, or may comprise a metallic material.

Meanwhile, the substrate 100 and the encapsulation substrate 300 are bonded by a sealant 250. The sealant 250 may include, for example, an organic sealant, an inorganic sealant, an organic-inorganic composite sealant, and any mixtures thereof.

A polarizer film 400 is attached on the encapsulation substrate 300. The polarizer film 400 may be formed in such a manner that iodine is absorbed by a polyvinyl alcohol film, and the iodine absorbs light. Thus, when the amount of iodine absorbed increases, light transmittance decreases, and when the amount of iodine absorbed decreases, the light transmittance increases. The polarizer film 400 of the organic light emitting display apparatus according to the present embodiment can correct a luminance difference between regions of the display unit 200. A detailed structure and the function of the polarizer film 400 will be described later. Meanwhile, the present embodiment of FIG. 1 corresponds to the top emission type organic light emitting display apparatus in which the image is realized toward the encapsulation substrate 300, so that the polarizer film 400 is attached on the encapsulation substrate 300. However, in the case of the bottom emission type organic light emitting display apparatus in which the image is realized toward the substrate 100, the polarizer film 400 is attached on the substrate 100. The polarizer film 400 is attached on the substrate 100 or the encapsulation substrate 300 toward which the image is realized, so that the polarizer film 400 corresponds to the display unit 200. In this regard, the location of attachment of the polarizer film 400 is not limited in the present embodiments.

Figure 4:
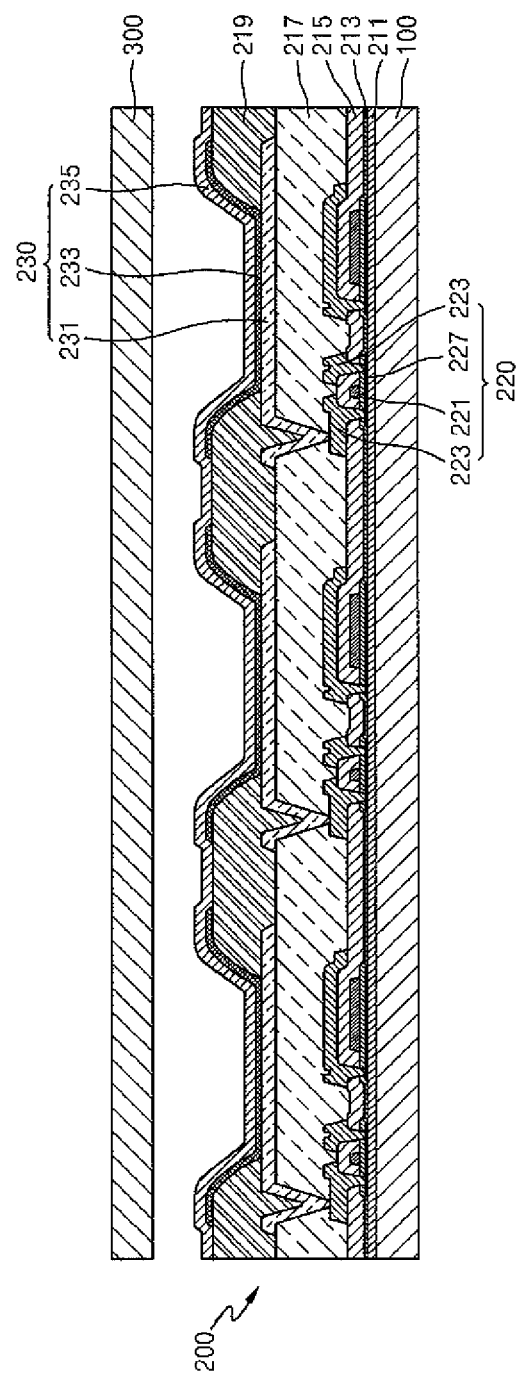
FIG. 4 is a cross-sectional view of a display unit in the organic light emitting display apparatus of FIG. 1.

A voltage applying unit 210 (refer to FIG. 4) applies a constant voltage to a common electrode 235 of the display unit 200. As illustrated in FIG. 4, the common electrode 235 is disposed to face a pixel electrode 231 arranged in each pixel, while covering an entire pixel, and the voltage applying unit 210 applies the constant voltage to the common electrode 235 via voltage lines 201. Holes injected from the pixel electrode 231 and electrons injected from the common electrode 235 meet each other in an intermediate layer 233 therebetween and emit light so that the image is realized.

A structure of the display unit 200 will now be described in detail.

Referring to FIG. 4, a plurality of thin film transistors (TFTs) 220 are arranged on the substrate 100, and an OLED 230 is arranged above each TFT 220. The OLED 230 includes the pixel electrode 231 that is electrically connected to the TFT 220, the common electrode 235 that is arranged to extend over an entire surface of the substrate 100, and an intermediate layer 233 that is disposed between the pixel electrode 231 and the common electrode 235 and that includes an emissive layer.

The TFT 220 including a gate electrode 221, source and drain electrodes 223, a semiconductor layer 227, a gate insulating layer 213, and an intermediate insulating layer 215 is arranged above the TFT 220. Also, the TFT 220 may comprise various types of thin film transistors including an organic thin film transistor in which the semiconductor layer 227 is formed of an organic material, or a silicon thin film transistor in which the semiconductor layer 227 is formed of silicon. A buffer layer 211 arranged between the TFT 220 and the substrate 100 is formed of a silicon oxide or a silicon nitride.

As described above, the OLED 230 includes the pixel electrode 231, the common electrode 235, and the intermediate layer 233 that is formed of an organic material and is disposed between the pixel electrode 231 and the common electrode 235, and in this regard, the intermediate layer 233 includes at least the emissive layer and may include a plurality of layers as will be described later.

The pixel electrode 231 functions as an anode electrode, and the common electrode 235 functions as a cathode electrode. Polarities of the pixel electrode 231 and the common electrode 235 may be switched.

The pixel electrode 231 may be arranged as a transparent electrode or a reflective electrode. When the pixel electrode 231 is arranged as the transparent electrode, the pixel electrode 231 may comprise, for example, ITO, IZO, ZnO or $In_2O_3$. When the pixel electrode 231 is arranged as the reflective electrode, the pixel electrode 231 may include a reflective film comprising, for example, Ag, Mg, Al, Pt, Pd, Au, Ni, Nd, Ir, Cr, or compounds containing these elements, and a film formed of ITO, IZO, ZnO or $In_2O_3$ on the reflective film.

The common electrode 235 may also be arranged as a transparent electrode or a reflective electrode. When the common electrode 235 is arranged as the transparent electrode, the common electrode 235 may include a deposited film, and an auxiliary electrode or a bus electrode line formed on the deposited film. The deposited film comprises Li, Ca, LiF/Ca, LiF/Al, Al, Mg, or compounds containing these elements which are deposited so as to face the intermediate layer 233 between the pixel electrode 331 and the common electrode 235. The auxiliary electrode or the bus electrode line comprises transparent electrode forming materials such as ITO, IZO, ZnO or $In_2O_3$. The common electrode 235 may be arranged as the reflective electrode by depositing, for example, Li, Ca, LiF/Ca, LiF/Al, Al, Mg, or compounds containing these elements.

Meanwhile, a pixel defining layer (PDL) 219 is arranged with a predetermined thickness on an outer part of the pixel electrode 231, thereby, covering an edge of the pixel electrode 231. The PDL 219 defines an emissive area, and enlarges a gap between the edge of the pixel electrode 231 and the common electrode 235 so as to prevent an electric field from being concentrated on the edge of the pixel electrode 231, thereby serving to prevent a short occurring between the pixel electrode 231 and the common electrode 235.

The intermediate layer 233 having the plurality of layers including at least the emissive layer is arranged between the pixel electrode 231 and the common electrode 235. The intermediate layer 233 may comprise low molecular weight organic materials or polymer organic materials.

In the case where the low molecular weight organic materials are used, the intermediate layer 233 may comprise a hole injection layer (HIL), a hole transport layer (HTL), an emissive layer (EML), an electron transport layer (ETL), an electron injection layer (EIL), or the like, which are laminated with a single or a complex structure. Various organic materials such as a copper phthalocyanine (CuPc), an N,N'-Di (naphthalene-1-yl)-N,N'-diphenylbenzidine (NPB), a tris-8-hydroxyquinoline aluminum (Alq3), and the like may be applied to the intermediate layer 333. The low molecular weight organic materials may be formed by using a vacuum deposition method using masks.

In the case where the polymer organic materials are used, in general, the intermediate layer 233 may have a structure formed of an HTL and an EML, PEDOT can be used as the HTL, and polyphenylenevinylene (PPV)-based and polyfluorene-based polymer organic materials can be used as the EML.

The OLEDs 230 are electrically connected respectively to the TFTs 220 at a lower position, and, if a planarization layer 217 is arranged to cover the TFTs 220, the OLEDs 230 are disposed on the planarization layer 317, and the pixel electrode 231 of each OLED 230 is electrically connected to each TFT 220 via a contact hole in the planarization layer 217.

Thus, when a pixel voltage is applied from the TFT 220 to the pixel electrode 231, and the constant voltage is applied from the voltage applying unit 210 to the common electrode 235, the holes and the electrons that are injected into the intermediate layer 233 are combined with each other due to a difference between the pixel voltage of the pixel electrode 231 and the constant voltage of the common electrode 235 so that light emission occurs.

Figure 2:
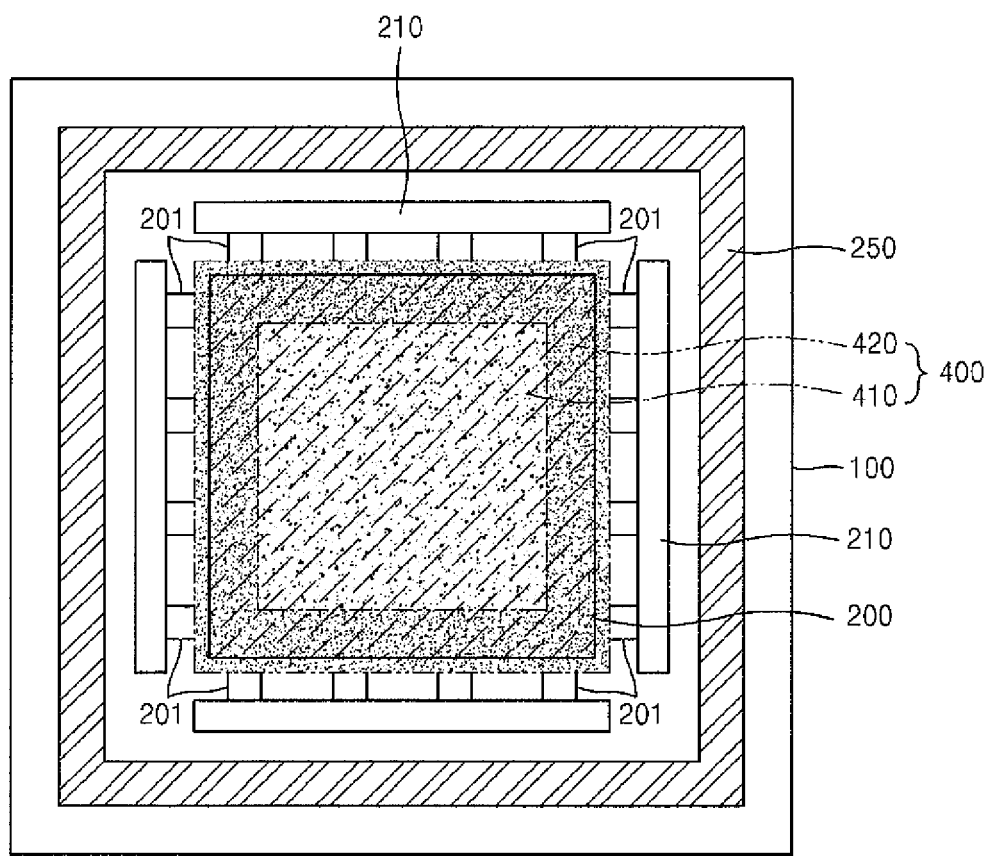
FIG. 2 is a plan view of the organic light emitting display apparatus of FIG. 1.

The pixel electrode 231 is applied via the source and drain electrodes 223 of the TFT 220 arranged in each pixel, whereas the constant voltage is uniformly applied from the voltage applying unit 210 arranged at an end of the display unit 200 to the common electrode 235 via the voltage lines 201, as illustrated in FIG. 2. Thus, the constant voltage is sufficiently applied to the common electrode 235 that is adjacent to the voltage applying unit 210, whereas a voltage less than the constant voltage is applied to the common electrode 235 that is relatively far from the voltage applying unit 210 since a voltage drop occurs due to an increase in resistance. FIG. 2 is a diagram of an organic light emitting display apparatus having a large-scale screen that is greater than about 30 inches. Referring to FIG. 2, since the screen is large, if the voltage applying unit 210 is arranged in only one end, a significant voltage drop occurs in the other end due to a great distance between the voltage applying unit 210 and the other end, so that the voltage applying unit 210 is arranged at four ends of the display unit 200. However, a significant voltage drop occurs in a center region of the display unit 200 which is relatively far from the voltage applying unit 210. When the voltage drop occurs, light emission in a region of the voltage drop decreases such that luminance deteriorates, and as a result, luminance of the center region further decreases compared to luminance in end regions of the display unit 200.

Figure 3:
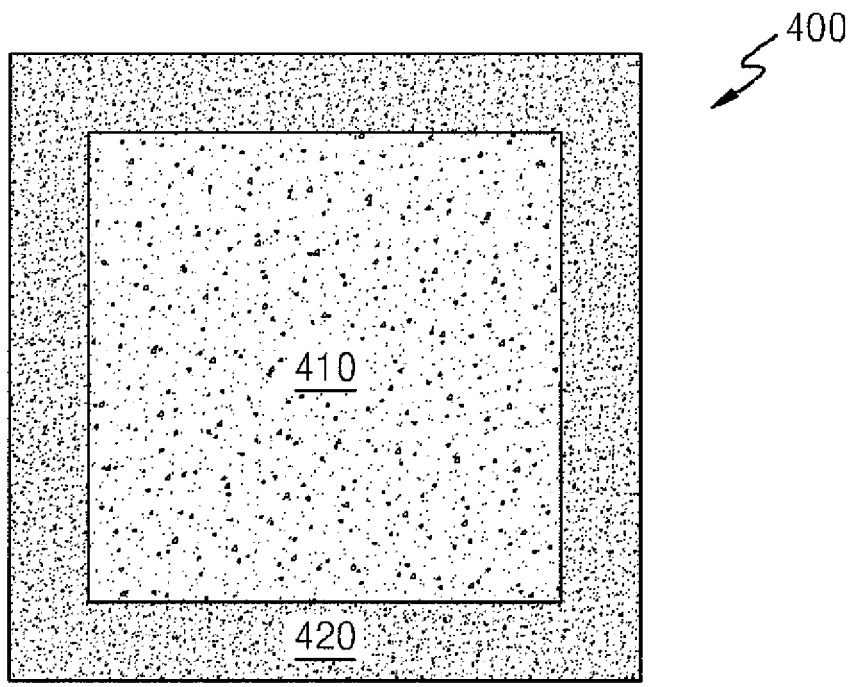
FIG. 3 is a plan view of a polarizer film in the organic light emitting display apparatus of FIG. 1.

In order to correct a luminance difference between the regions of the display unit 200, the polarizer film 400 has a structure including a first region 410 and a second region 420 having different light transmittances, as illustrated in FIG. 3. The first region 410 corresponds to the center region of the display unit 200, which has a relatively low luminance, and the second region 420 corresponds to the end regions of the display unit 200, which have a relatively high luminance.

The light transmittance of the first region 410 is set to be higher than the light transmittance of the second region 420. That is, iodine for absorbing light is relatively less absorbed in the first region 410, and the iodine is relatively more highly absorbed in the second region 420. By setting the light transmittance of the first region 410 to be higher, while the display unit 200 realizes an image of which luminance is higher in the end regions than in the center region, the polarizer film 400 transmits light in the first region 410 corresponding to the center region, more than the second region 420 corresponding to the end regions, so that the luminance difference between the center region and the end regions is compensated for.

For example, when the luminance of light entering the first region 410 of the polarizer film 400 is referred to as B1, and the luminance of light entering the second region 420 of the polarizer film 400 is referred to as B2, and when light transmittance of the first region 410 is referred to as T1, and light transmittance of the second region 420 is referred to as T2, if light transmittance is set to satisfy B2/B1=T1/T/2, the luminance difference may be appropriately compensated for.

As described above, a difference between the light transmittance of the first region 410 and the light transmittance of the second region 420 of the polarizer film 400 may be formed by adjusting the amount of iodine to be absorbed by the polyvinyl alcohol film that is a base member. For example, the difference may be achieved by spraying the iodine by using a mask. That is, the iodine is sprayed on an entire polyvinyl alcohol film including the first and second regions 410 and 420 and then absorbed to allow the polyvinyl alcohol film to have the light transmittance of T1. After that, the iodine is further sprayed and absorbed while the first region 410 is covered by a mask, so that only the second region 420 has the light transmittance of T2. By doing so, the light transmittance of the second region 420 which further absorbs the iodine for absorbing the light, is relatively decreased, so that the compensation of the luminance difference may be possible.

Thus, by arranging a plurality of regions having different light transmittances in a main portion of the polarizer film 400, the luminance difference in the display unit 200 may be appropriately compensated for.

Figure 5:
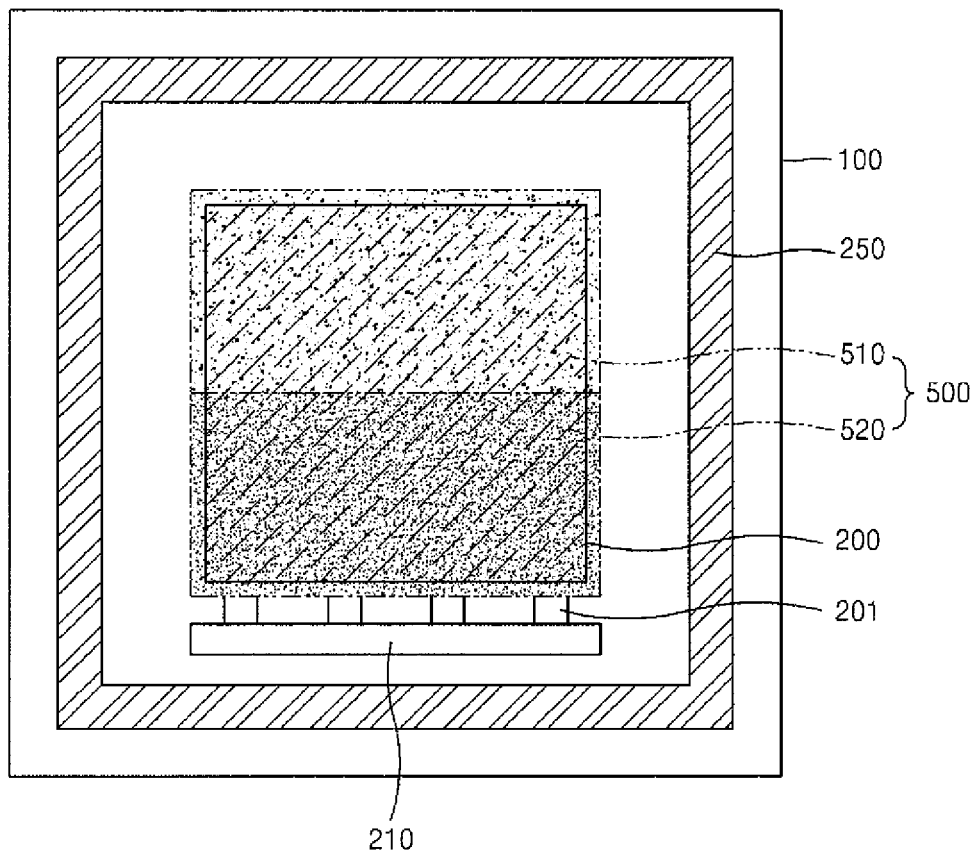
FIG. 5 is a cross-sectional view of an organic light emitting display apparatus according to another embodiment.
Figure 6:
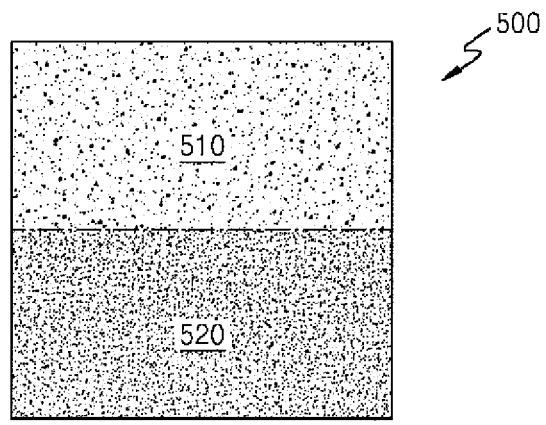
FIG. 6 is a plan view of the organic light emitting display apparatus of FIG. 5.

FIGS. 5 and 6 are diagrams of an organic light emitting display apparatus and a polarizer film 500 according to another embodiment.

While the previous embodiment corresponds to the case where the voltage applying unit 210 is arranged at four ends of the display unit 200 due to the large screen greater than about 30 inches, the present embodiment corresponds to an apparatus for embodying a small screen of about 7 inches, where a voltage applying unit 210 is arranged only in one end region of a display unit 200.

In an exemplary embodiment, a voltage is applied from the voltage applying unit 210 to the display unit 200 via voltage lines 201, and in this regard, a voltage drop seldom occurs in the one end region of the display unit 200 adjacent to the voltage applying unit 210. However, the voltage drop occurs in the other end region that is relatively far from the voltage applying unit 210. When the voltage drop occurs, light emission in a region of the voltage drop deteriorates such that luminance in the other end region decreases.

In order to compensate for a luminance difference between regions of the display unit 200, the polarizer film 500 has a structure including a first region 510 and a second region 520 having different light transmittances. The first region 510 corresponds to the other end region of the display unit 200 which has a relatively low luminance and which is relatively far from the voltage applying unit 210. The second region 520 corresponds to the one end region of the display unit 200 which has a relatively high luminance and which is relatively adjacent to the voltage applying unit 210.

The light transmittance of the first region 510 is set to be higher than the light transmittance of the second region 520. Thus, iodine for absorbing light is relatively less absorbed in the first region 510, and the iodine is relatively more highly absorbed in the second region 520. By doing so, while the display unit 200 realizes an image of which luminance is higher in the one end region than in the other end region, the polarizer film 500 transmits light in the first region 510 corresponding to the other region, more than the second region 520 corresponding to the one end region, so that a luminance difference between the one end region and the other end region is compensated for.

For example, when luminance of light entering the first region 510 of the polarizer film 500 is referred to as B1, and luminance of light entering the second region 520 of the polarizer film 500 is referred to as B2, and when light transmittance of the first region 510 is referred to as T1, and light transmittance of the second region 520 is referred to as T2, if light transmittance is set to satisfy B2/B1=T1/T/2, the luminance difference may be appropriately compensated for.

As described above, a difference between the light transmittance of the first region 510 and the light transmittance of the second region 520 of the polarizer film 500 occurs due to adjusting of the amount of iodine to be absorbed by a polyvinyl alcohol film that is a base member. That is, the iodine is sprayed on an entire polyvinyl alcohol film including the first and second regions 510 and 520 and then absorbed to allow the polyvinyl alcohol film to have the light transmittance of T1. After that, the iodine is further sprayed and absorbed while the first region 510 is covered by a mask, so that only the second region 520 has the light transmittance of T2. By doing so, the light transmittance of the second region 520 to which the iodine for absorbing the light is further absorbed is relatively decreased, so as to enable compensation for the luminance difference.

Alternatively, the polyvinyl alcohol film may be soaked in an iodine liquid for absorption, and in this regard, a time period for a soaking operation may vary so that different light transmittances may be obtained. That is, an entire polyvinyl alcohol film may be soaked in the iodine liquid so as to allow the polyvinyl alcohol film to have the light transmittance of T1, and then the first region 510 is drawn out of the iodine liquid and the second region 520 is further soaked in the iodine liquid so as to have the light transmittance of T2. By doing so, the light transmittance of the second region 520 to which the iodine for absorbing the light is further absorbed is relatively decreased, so that the compensation of the luminance difference may be possible.

Thus, by arranging a plurality of regions having different light transmittances in a main portion of the polarizer film 500, the luminance difference in the display unit 200 may be appropriately compensated.

As described above, according to the organic light emitting display apparatus and the polarizer film in one or more of the above embodiments, the luminance difference due to the voltage drop may be compensated for by using the polarizer film so that a uniform luminance may be obtained when the image is realized.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. An organic light emitting display apparatus comprising:
a substrate;
a display unit arranged on the substrate configured to realize an image;
a voltage applying unit configured to apply voltage to the display unit;
an encapsulation substrate which encapsulates and is longer than the display unit: and a polarizer film shorter than the encapsulation substrate comprising a plurality of regions arranged on and contacting the encapsulation substrate that faces the image realized by the display unit,
wherein the plurality of regions have substantially the same thickness and different nonzero light transmittances and comprise a first region, and a second region with a transmittance higher than the first region;
the second region corresponds to the center region of the display unit, and the first region corresponds to end portions of the display unit,
wherein the end portions surround the second region, and wherein the encapsulation substrate is between the polarizer film and the display unit, and
wherein the display unit comprises a pixel electrode arranged in each pixel, and a common electrode arranged to extend over entire pixels, and wherein the voltage applying unit applies a constant voltage to the common electrode via a plurality of voltage lines connecting the voltage supplying unit to the common electrode and disposed on at least two sides of the display unit.

2. The organic light emitting display apparatus of claim 1, wherein the first region is in the display unit and is adjacent to the voltage applying unit, and the second region is in the display unit and is relatively far from the voltage applying unit.

3. The organic light emitting display apparatus of claim 1, wherein the voltage applying unit is arranged to surround the display unit.

4. The organic light emitting display apparatus of claim 1, wherein the voltage applying unit is arranged to be adjacent to one side region of the display unit, and wherein the first region corresponds to the one side region of the display unit, and the second region corresponds to another side region of the display unit.

5. The organic light emitting display apparatus of claim 1, wherein the polarizer film comprises a polyvinyl alcohol film.

6. The organic light emitting display apparatus of claim 5 wherein the polyvinyl alcohol film further comprises absorbed iodine.

7. The organic light emitting display apparatus of claim 6, wherein light transmittances of the plurality of regions become different from each other according to a difference between amounts of the iodine absorbed by the polyvinyl alcohol film.

8. The organic light emitting display apparatus of claim 7, wherein the difference between the amounts of the absorbed iodine is due to spraying of the polyvinyl alcohol film with an iodine liquid while a portion of the polyvinyl alcohol film is covered.

9. The organic light emitting display apparatus of claim 7, wherein the difference between the amounts of the absorbed iodine is due to a difference between time periods during which the polyvinyl alcohol film is soaked in an iodine liquid.

10. The polarizer film of claim 9, wherein the plurality of regions comprise a first region corresponding to one end region of the main portion, and a second region corresponding to another end region of the main portion.

11. The polarizer film of claim 9, wherein the difference between the amounts of the absorbed iodine is due to a difference between time periods during which the polyvinyl alcohol film is soaked in an iodine liquid.

* * * * *